(12) United States Patent
Stowe et al.

(10) Patent No.: US 9,507,266 B2
(45) Date of Patent: Nov. 29, 2016

(54) SYSTEMS AND METHODS FOR IMPLEMENTING ADVANCED SINGLE PASS CLEANING OF A REIMAGEABLE SURFACE IN A VARIABLE DATA DIGITAL LITHOGRAPHIC PRINTING DEVICE

(71) Applicant: Palo Alto Research Center Incorporated, Palo Alto, CA (US)

(72) Inventors: Timothy D Stowe, Alameda, CA (US); Bruce Earl Thayer, Spencerport, NY (US); Sourobh Raychaudhuri, Mounain View, CA (US); Gregory B Anderson, Emerald Hills, CA (US); Marty J. Sheridan, Redwood City, CA (US)

(73) Assignees: Xerox Corporation, Norwalk, CT (US); Palo Alto Research Center Incorporated, Palo Alto, CA (US)

( * ) Notice: Subject to any disclaimer, the term of this patent is extended or adjusted under 35 U.S.C. 154(b) by 187 days.

(21) Appl. No.: 14/318,651

(22) Filed: Jun. 29, 2014

(65) Prior Publication Data

US 2015/0378263 A1 Dec. 31, 2015

(51) Int. Cl.
*G03F 7/20* (2006.01)
*G03F 7/24* (2006.01)
*B41F 35/02* (2006.01)
*B41F 35/00* (2006.01)

(52) U.S. Cl.
CPC .............. *G03F 7/24* (2013.01); *B41F 35/006* (2013.01); *B41F 35/02* (2013.01)

(58) Field of Classification Search
CPC .............................. B41F 35/02; B41F 35/006
See application file for complete search history.

(56) References Cited

U.S. PATENT DOCUMENTS

| | | | | |
|---|---|---|---|---|
| 4,066,017 A | * | 1/1978 | Garcowski | B41F 35/06 101/148 |
| 9,156,248 B1 | * | 10/2015 | Thayer | B41F 35/04 |
| 2004/0089179 A1 | * | 5/2004 | Link | B41F 35/00 101/424 |
| 2012/0103212 A1 | | 5/2012 | Stowe et al. | |
| 2012/0103221 A1 | | 5/2012 | Stowe et al. | |

* cited by examiner

*Primary Examiner* — Jennifer Simmons
*Assistant Examiner* — Michael Robinson
(74) *Attorney, Agent, or Firm* — Ronald E. Prass, Jr.; Prass LLP

(57) ABSTRACT

A system and method are provided for enclosing a plurality of cleaning unit components in a moist cleaning unit environment, the plurality of cleaning unit components cooperating to employ a cleaner roller in an image forming device to facilitate effective cleaning of a reimageable surface in an image forming device using a proposed variable data digital lithographic image forming architecture. A range of solvents may be applied to a hard smooth high surface energy surface of the cleaner roll and a cleaning unit component internally positioned within the cleaning enclosure to clean the surface of the cleaner roll. Mechanical components are properly placed prior to the cleaner roll-reimageable surface nip to ensure that residual liquid on a surface of the cleaner roll is removed.

21 Claims, 3 Drawing Sheets ns of the imaging member 110 should ideally absorb most of the laser energy emitted from the optical patterning subsystem 130 close to the surface to minimize energy wasted in heating the dampening solution and to minimize lateral spreading of heat in order to maintain a high spatial resolution capability. While the optical patterning subsystem 130 is described above as being a laser emitter, it should be understood that a variety of different systems may be used to deliver the optical energy to pattern the dampening solution.

SYSTEMS AND METHODS FOR IMPLEMENTING ADVANCED SINGLE PASS CLEANING OF A REIMAGEABLE SURFACE IN A VARIABLE DATA DIGITAL LITHOGRAPHIC PRINTING DEVICE

BACKGROUND

1. Field of Disclosed Subject Matter

This disclosure relates to systems and methods for providing improved single pass cleaning of ink residue and other residual products from a reimageable surface on an imaging member in a proposed variable data digital lithographic image forming architecture.

2. Related Art

U.S. Patent Application Publication No. 2012/0103212 A1 (the 212 Publication) published May 3, 2012 and based on U.S. patent application Ser. No. 13/095,714, which is commonly assigned and the disclosure of which is incorporated by reference herein in its entirety, proposes systems and methods for providing variable data lithographic and offset lithographic printing or image receiving medium marking in image forming system. The systems and methods disclosed in the 212 Publication are directed to improvements on various aspects of previously-attempted variable data imaging lithographic marking concepts to achieve effective truly variable digital data lithographic printing.

According to the 212 Publication, a reimageable surface is provided on an imaging member, which may be a drum, plate, belt or the like. The reimageable surface may be composed of, for example, a class of materials commonly referred to as silicones, including polydimethylsiloxane (PDMS) among others. The reimageable surface may be formed of a relatively thin layer over a mounting layer, a thickness of the relatively thin layer being selected to balance printing or marking performance, durability and manufacturability.

The 212 Publication describes, in requisite detail, an exemplary variable data lithography system 100 such as that shown, for example, in FIG. 1. A general description of the exemplary system 100 shown in FIG. 1 is provided here. Additional details regarding individual components and/or subsystems shown in the exemplary system 100 of FIG. 1 may be found in the 212 Publication.

As shown in FIG. 1, the exemplary system 100 may include an imaging member 110. The imaging member 110 in the embodiment shown in FIG. 1 is a drum, but this exemplary depiction should not be read in a manner that precludes the imaging member 110 being a plate or a belt, or of another known configuration. The imaging member 110 is used to apply an inked image to an image receiving media substrate 114 at a transfer nip 112. The transfer nip 112 is produced by an impression roller 118, as part of an image transfer mechanism 160, exerting pressure in the direction of the imaging member 110. The exemplary system 100 may be used for producing images on a wide variety of image receiving media substrates 114. The 212 Publication also explains the wide latitude of marking (printing) materials that may be used, including marking materials with pigment densities greater than 10% by weight. As does the 212 Publication, this disclosure will use the term ink to refer to a broad range of printing or marking materials to include those which are commonly understood to be inks, pigments, and other materials which may be applied by the exemplary system 100 to produce an output image on the image receiving media substrate 114.

The 212 Publication depicts and describes details of the imaging member 110 including the imaging member 110 being comprised of a reimageable surface layer formed over a structural mounting layer that may be, for example, a cylindrical core, or one or more structural layers over a cylindrical core.

The exemplary system 100 includes a dampening solution subsystem 120 generally comprising a series of rollers, which may be considered as dampening rollers or a dampening unit, for uniformly wetting the reimageable surface of the imaging member 110 with dampening solution. A purpose of the dampening solution subsystem 120 is to deliver a layer of dampening solution, generally having a uniform and controlled thickness, to the reimageable surface of the imaging member 110.

Once the dampening solution is metered onto the reimageable surface of the imaging member 110, a thickness of the dampening solution may be measured using a sensor 125 that may provide feedback to control the metering of the dampening solution onto the reimageable surface of the imaging member 110 by the dampening solution subsystem 120.

Once a precise and uniform amount of dampening solution is provided by the dampening solution subsystem 120 on the reimageable surface of the imaging member 110, and optical patterning subsystem 130 may be used to selectively form a latent image in the uniform dampening solution layer by image-wise patterning the dampening solution layer using, for example, laser energy. The reimageable surface of the imaging member 110 should ideally absorb most of the laser energy emitted from the optical patterning subsystem 130 close to the surface to minimize energy wasted in heating the dampening solution and to minimize lateral spreading of heat in order to maintain a high spatial resolution capability. While the optical patterning subsystem 130 is described above as being a laser emitter, it should be understood that a variety of different systems may be used to deliver the optical energy to pattern the dampening solution.

The mechanics at work in the patterning process undertaken by the optical patterning subsystem 130 of the exemplary system 100 are described in detail with reference to FIG. 5 in the 212 Publication. Briefly, the application of optical patterning energy from the optical patterning subsystem 130 results in selective evaporation of portions of the layer of dampening solution.

Following patterning of the dampening solution layer by the optical patterning subsystem 130, the patterned layer over the reimageable surface of the imaging member 110 is presented to an inker subsystem 140. The inker subsystem 140 is used to apply a uniform layer of ink over the layer of dampening solution and the reimageable surface layer of the imaging member 110. The inker subsystem 140 may use an anilox roller to meter an ink onto one or more ink forming rollers that are in contact with the reimageable surface layer of the imaging member 110. Separately, the inker subsystem 140 may include other traditional elements such as a series of metering rollers to provide a precise feed rate of ink to the reimageable surface. The inker subsystem 140 may deposit the ink to the pockets representing the imaged portions of the reimageable surface, while ink deposited on the unformatted portions of the dampening solution will not adhere based on the hydrophobic and/or oleophobic nature of those portions.

The cohesiveness and viscosity of the ink residing in the reimageable layer of the imaging member 110 may be modified by a number of mechanisms. One such mechanism may involve the use of a rheology (complex viscoelastic modulus) control subsystem 150. The rheology control system 150 may form a partial crosslinking core of the ink on the reimageable surface to, for example, increase ink cohesive strength relative to the reimageable surface layer. Curing mechanisms may include optical or photo curing, heat curing, drying, or various forms of chemical curing. Cooling may be used to modify rheology as well via multiple physical cooling mechanisms, as well as via chemical cooling.

The ink is then transferred from the reimageable surface of the imaging member 110 to a substrate of image receiving medium 114 using a transfer subsystem 160. The transfer occurs as the substrate 114 is passed through a transfer nip 112 between the imaging member 110 and an impression roller 118 such that the ink within the voids of the reimageable surface of the imaging member 110 is brought into physical contact with the substrate 114. With the adhesion of the ink having been modified by the rheology control system 150, modified adhesion of the ink causes the ink to adhere to the substrate 114 and to separate from the reimageable surface of the imaging member 110. Careful control of the temperature and pressure conditions at the transfer nip 112 may allow transfer efficiencies for the ink from the reimageable surface of the imaging member 110 to the substrate 114 to exceed 95%. While it is possible that some dampening solution may also wet substrate 114, the volume of such a dampening solution will be minimal, and will rapidly evaporate or be absorbed by the substrate 114.

In certain offset lithographic systems, it should be recognized that an offset roller, not shown in FIG. 1, may first receive the ink image pattern and then transfer the ink image pattern to a substrate according to a known indirect transfer method using an offset roller or other device as an intermediate transfer body.

Following the transfer of the majority (95+%) of the ink to the substrate 114 at the transfer nip 112, any residual ink and/or residual dampening solution must be removed from the reimageable surface of the imaging member 110 to prepare the reimageable surface to repeat the digital image forming operation without "ghosting." This removal is most preferably undertaken without scraping or wearing the reimageable surface of the imaging member 110. An air knife or other like non-contact device may be employed to remove residual products. It is anticipated, however, that some amount of ink residue may remain. Removal of such remaining ink residue may be accomplished through use of some form of active cleaning subsystem 170. The 212 Publication describes details of such a cleaning subsystem 170 including at least a first cleaning member such as a sticky or tacky member in physical contact with the reimageable surface of the imaging member 110, the sticky or tacky member removing residual ink and any remaining small amounts of surfactant compounds from the dampening solution of the reimageable surface of the imaging member 110. The sticky or tacky member may then be brought into contact with a smooth roller to which residual ink may be transferred from the sticky or tacky member, the ink being subsequently stripped from the smooth roller by, for example, a doctor blade or other like device and collected as waste.

The 212 Publication details other mechanisms by which cleaning of the reimageable surface of the imaging member 110 may be facilitated. Regardless of the cleaning mechanism, however, cleaning of the residual ink and dampening solution from the reimageable surface of the imaging member 110 is essential to preventing ghosting in subsequent image forming operations as the images change. Once cleaned, the reimageable surface of the imaging member 110 is again presented to the dampening solution subsystem 120 by which a fresh layer of dampening solution is supplied to the reimageable surface of the imaging member 110, and the process is repeated.

SUMMARY OF DISCLOSED EMBODIMENTS

According to the above proposed structure, variable data digital lithography systems have attracted attention in producing truly variable digital images in a lithographic image forming system. The above-described architecture combines the functions of the imaging plate and potentially a transfer blanket into a single imaging member 110.

Experimentation continues to improve and optimize individual components in the variable data digital lithography system, including such aspects as a composition of the reimageable surface, a composition of the inks and a configuration of the cleaning system.

Since the filing of the application that published as the 212 Publication, an alternative configuration for at least the cleaning system has emerged. The currently-proposed cleaning system uses a smooth, high surface energy cleaner roll to contact the reimageable surface of the imaging member to clean residual ink that did not transfer to print media from the reimageable surface. The materials for the surfaces of the cleaner rolls experimentally include chrome-coated steel rollers, glass-coated rollers, and the like, all providing a hard smooth surface that will cause the residual ink that remains on the reimageable surface to be transferred to the cleaner roller.

The residual ink is then removed from the surface of the cleaner roller by a cleaning web moistened with a cleaning fluid. Typically, a polyester web may be used as the cleaning web to remove the residual products from the cleaner roller for disposal. The non-woven web rubs against the cleaning roller wiping the residual ink off of the cleaner roller. In conventional lithographic systems, cleaning webs were typically soaked with some manner of cleaning solvent. These conventional webs were used to clean the lithographic plates and blanket rolls. The cleaning operations in conventional lithographic systems typically took place when the conventional lithographic printing system was not running. The components were typically cleaned between imaging operations, including in a particular cleaning operation that may require that the image forming device to be off-line for an extended period of time.

In the variable data digital lithography process, there is a requirement for the cleaning processes to be continuous. Even though the target ink transfer rate is 95+%, there will nonetheless be residual ink on the blanket cylinder, and the residual ink must be completely removed to prevent ghosting and other image quality defects.

A number of fluids have been tried to facilitate the continual wetted cleaning process undertaken by web interaction with the cleaner roller. Water with a small amount of ionic surfactant such as used in common dishwasher detergents or common low residue cleaning solutions such as Liquinox™ has emerged as a candidate fluid based on its low cost and its being environmentally benign. Isopropyl alcohol in combination with water tends to work better than water alone. The difficulty is that isopropyl alcohol presents certain environmental concerns related to the fact it is a volatile organic compound or VOC. The cleaning fluid must be evaporated from the cleaner roller surface prior to the cleaner roller again entering the cleaning nip formed between the cleaner roller and the reimageable surface of the imaging member for another cleaning pass. The cleaning fluid is currently being evaporated through conventional evaporative processes including through the use of an air knife. The use of any cleaning fluid other than water complicates this process with, for example, a need to filter the atmosphere into which the other fluids may be evaporated.

Unfortunately, it has been shown that water alone may not effectively clean ink from all potential cleaner roller materials. In some cases a small amount of IPA, 1-2% for example, may be necessary to add to water. For example, glass, chrome and hard anodized aluminum are cleaned well, but water does not clean the residual ink from mylar or aluminum surfaces all that well. The cleaner roller surface, it has been determined, should be mirror smooth. This requires great care in preparing the surface of the cleaner roller, e.g., super-finishing, and a hard material that can be successfully smoothed and will resist scratching after it has been fabricated and when in use. Since the variable data digital lithography process is intended for production printers, e.g., label presses, long life, reliability and good print quality are essential for low run cost and customer acceptance. The variable data digital lithography system cleaner unit with a web and cleaning fluid would require that the cleaner roller be periodically replaced due to fine scratches accumulated in normal operation. An effectiveness of cleaning may be optimized by using a number of differing, potentially volatile solvents.

In view of the above conditions, it would be advantageous to find some manner by which to enhance the cleaning operation of a cleaner roll while providing a broader latitude of solvents that may be contained in a generally enclosed cleaning unit. The reimageable surface of the imaging member has comparatively low surface energy to promote the above-indicated ink transfer rates. High surface energy materials may be used at least on the surface of the cleaner roll, these materials may include chrome, steel glass, and other materials.

Exemplary embodiments of the disclosed systems and methods may provide a scheme for advanced cleaning of the reimageable surface of the imaging member.

Exemplary embodiments may involve employing a high surface energy cleaning roll. A surface material for the cleaning roll may be selected to enhance the transfer of the residual ink from the reimageable surface to the cleaner roll.

Exemplary embodiments may wet the surface of the cleaner roll in at least one portion of the cleaning cycle. The wetting of the surface of the cleaner roll must be contained in order that any residual wetness on the surface of the cleaner roll will not act as a splitting layer between the cleaner roll and the reimageable surface. Water will, for example, mask the high surface energy of the cleaner roll.

Exemplary embodiments may use multiple mechanical components, including at least one of a squeegee blade and an air knife, to remove residual wetness from the surface of the cleaner roll.

Exemplary embodiments may enclose the cleaning environment between the cleaner roll and the reimageable surface to (1) contain the wetting within an enclosed moist environment, and (2) minimize the potential escape of organics to the environment. The cleaning solution used for wetting the cleaner roll may, for example, be water based with cleaning solvent including isopropyl alcohol (IPA) in it. Use of IPA requires a carefully controlled closed cleaning environment/containment in order to keep from contaminating an area around the image forming system and in order to conform with certain environmental standards.

Exemplary embodiments may replace a conventional cleaning web with, for example, a web or sponge wrapped roller for contacting the cleaner roll to undertake the cleaning and wetting of the cleaner roll surface.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed systems and methods for providing improved single pass cleaning of ink residue and other residual products from a reimageable surface on an imaging member in a proposed variable data digital lithographic image forming architecture will be described, in detail, with reference to the following drawings, in which.

DETAILED DESCRIPTION OF THE DISCLOSED EMBODIMENTS

The systems and methods for providing improved single pass cleaning of ink residue and other residual products from a reimageable surface on an imaging member in a proposed variable data digital lithographic image forming architecture according to this disclosure will generally refer to this specific utility or function for those systems and methods. Exemplary embodiments described and depicted in this disclosure should not be interpreted as being specifically limited to any particular configuration of the described cleaning unit. Any advantageous adaptation of a digital image forming process that may benefit from implementation of a unique release layer cleaning process is contemplated as being included in this disclosure.

Specific reference to, for example, lithographic printing techniques, and to the proposed variable data digital lithographic image forming device should not be considered as being limited to any particular configuration of the techniques or devices, as described. The terms "image forming device," "offset lithographic printing device/system," "offset lithographic marking device/system" and the like, as referenced throughout this disclosure are intended to refer globally to a class of devices and systems that carry out what are generally understood as lithographic marking functions as those functions would be familiar to those of skill in the art. Additionally, while references will generally be made to individual cleaning unit components, these references are intended to be exemplary only and not limiting to the disclosed subject matter.

U.S. Patent Application Publication No. 2012/0103221 A1 (the 221 Publication) published May 3, 2012 and with overlapping inventorship describes one architectural solution in which an adhesive tacky roller is used to first pick up residues from the reimageable surface. However, a difficulty with the architecture disclosed in the 221 Publication is that the tacky roller may never be fully cleaned off after some time of building up ink residue by the second smooth roller, as its adhesive forces can be higher than the second smooth roller. This may ultimately result in a decreased efficiency of cleaning over time. In addition, solvents used to clean off the hard smooth secondary roller if not fully evaporated off of this roller may tend to provide a splitting layer, which further reduces the system cleaning efficiency.

Figure 1:
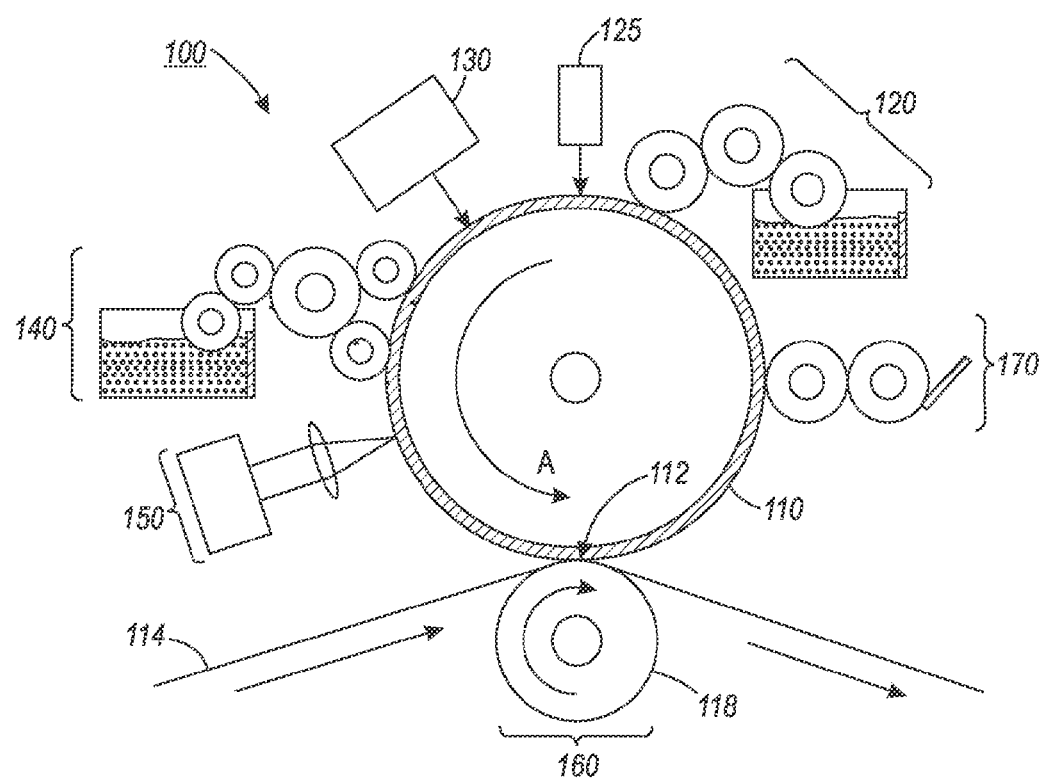
FIG. 1 illustrates a schematic representation of a proposed variable data digital lithographic image forming system.
Figure 2:
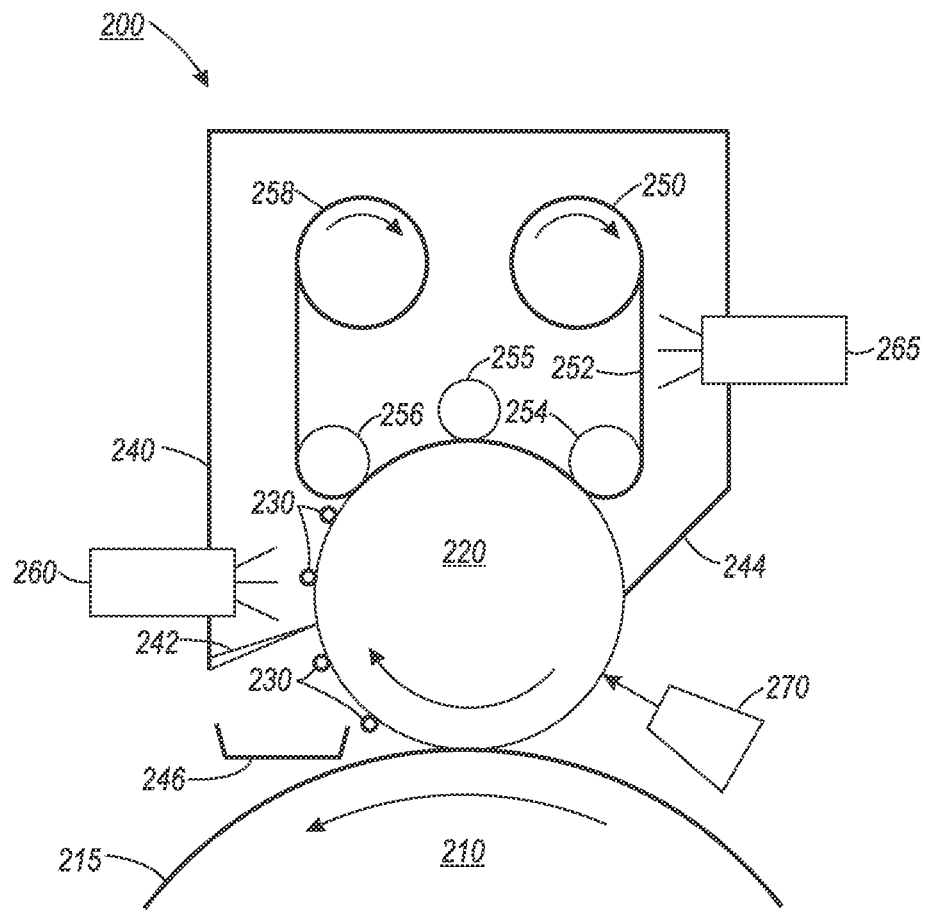
FIG. 2 illustrates a schematic representation of an exemplary embodiment of an improved single pass cleaning unit for use in a variable data digital lithographic image forming system according to this disclosure.

FIG. 2 illustrates a schematic representation of an exemplary embodiment of an improved single pass cleaning unit 200 for use in a variable data digital lithographic image forming system according to this disclosure. Comparing the orientations of the depiction of the cleaning system in FIG. 2 and the depiction of the cleaning unit component 170 in FIG. 1 will inform those of skill in the art that no particular orientation of the particular cleaning elements should be implied from these depictions.

The exemplary improved cleaning unit 200 may include a hard-surfaced cleaner roll 220 that is brought into contact with a reimageable surface 215 of an imaging unit 210, in the manner described in detail above, to remove residual product components, including at least residual ink 230, from the reimageable surface 215. In this manner, at least the residual ink 230 is cleaned from the reimageable surface 215 by the cleaner roller 220 in a manner that will be described in greater detail below.

The purpose of the high surface energy surface of the cleaner roll 220 is to attract ink and paper dust from the low surface energy reimageable surface 215. Experiments have shown higher surface energy for the cleaner roll 220 yields better residue collection efficiency. Higher surface smoothness for the cleaner roll 220 means better microscopic contact across the reimageable surface 215 as well. High surface energy, smooth surface materials such as hard chrome coatings have proven to work well. Other materials including high surface energy polymers such as polyimide or kapton, smooth metals such as hardened nickel, or smooth glass overcoats may also work well. In addition, there are chrome replacements based on HVOF (high velocity oxyfuel) process such as Tungsten carbide (WC)-cobalt (Co) that also can be made very mirror smooth with Ra<1.

The exemplary improved cleaning unit 200 may include an enclosure 240 for segregating a wetted cleaning unit environment surrounding at least a portion of the cleaner roll 220 from the surrounding environment within the image device and around the image forming device. The enclosure 240 may include an enclosure flap 242 that rides along the cleaner roller 220 to complete the enclosure 240. The enclosure 240 may also include an enclosure squeegee blade 244 that rides along a surface of the cleaner roll 220.

The exemplary improved cleaning unit 200 may include a cleaning web system. It should be noted, however, as indicated above, that the cleaning web system may be replaceable, in embodiments, with a plurality of sponge-surfaced rollers or other like component for cleaning the surface of the cleaner roll 220. The cleaning web system may include a supply roller 250 supplying cleaning web 252 threaded around at least a pair of web backer rollers 254,256 and taken up by a used web roller 258. The web backer rollers 254,256 may be positioned widely spaced apart with reference to the surface of the cleaner roll 220 to provide a longer engagement length for the cleaning web 252 across a surface of the cleaner roll 220. The longer engagement length may be preferable for implementing optimally efficient single pass cleaning. For additional pressure, one or more additional rollers 255 may be provided to further force the cleaning web 252 against the surface of the cleaner roll 220. The enclosure 240 may have associated with it one or more drip trays 246 to keep any residue from the cleaner roll 220 and/or the enclosure 240 from depositing/re-depositing on the reimageable surface 215 of the imaging unit 210.

The cleaning web 252 should be sufficiently soaked with solvent from, for example, a pre-roll web moistening unit 265 as friction can cause local heating and lead to premature UV ink residue curing otherwise. Once cured, the ink residue is hard to remove off of the cleaner roll 220. Experimentally, pre-soaking the cleaning web 252 helps reduce friction and the necessary cleaning web pressure. While some amount of alcohol may be necessary as a solvent to remove the ink, the heat generated from the web contact can easily evaporate the alcohol quickly. In one experiment, for example, a 20% ethanol/80% water mixture was used. Therefore, a high boiling point solvent such as water is highly desirable to keep heat from building up. In addition, water does not add cost and has a high boiling point compared to many solvents. The pre-roll web moistening unit 265 may be built into a wall of the enclosure 240 and provided to specifically moisten the cleaning web 252 on the backside just before a beginning of the elongated engagement nip between the cleaning web 252 and the cleaner roll 220. The wetted cleaning web 252 is usable to clean the residual product components, including at least the residual ink 230 from a surface of the cleaner roll 220. The cleaning web 252 can also catch dust and particles as well as removing residual ink 230. Residual ink and particles tend to build up preferentially on the leading edge of the cleaning web 252, therefore the cleaning web 252 may be moved slowly in a direction opposite the rotation of the cleaning roll 252 so as to move this lead edge build up off of the cleaner roll 252.

In implementations, the cleaning web 252 may remain stationary between the supply roller 250 and the used web roller 258 until the cleaning web 252 has accumulated ink to its cleaning capacity. At cleaning capacity, it can be anticipated that cleaned residual products, including the residual ink 230 forms a layer on the web that is thick enough to split and pass through the web nip rather than being trapped in the cleaning web 252. At this point cleaning is degraded. The cleaning web 252 may be advanced when the cleaning web 252 reaches a pre-determined cleaning capacity or preferably just before a cleaning degradation/failure occurs.

The exemplary improved cleaning unit 200 may include a cleaner roll pre-wetting unit 260 with a higher cleaning solvent content of cleaning agent. The cleaner roll pre-wetting unit 260 may also be built into a wall of the enclosure 240. Pre-wetting of the residual ink 230 may help loosen it up and put solvent, such as a higher concentration alcohol, precisely where they may be most effective on a surface of the cleaner roll 220 to emulsify or partially emulsify the residual products including the residual ink 230 on the surface of the cleaner roll 220. Based upon imaging information area coverage, more or less solvent may be applied for the pre-wetting conditions on the surface of the cleaner roll 220. The cleaner roll pre-wetting unit 260 may include, or be configured as, a fine spray air gun to disperse solvent directly over the residual ink 230 adhering to the surface of the cleaner roll 220. A benefit of having an adjustable spray nozzle is that depending upon the ink residue load, the spray rate can be adjusted appropriately. For example, if a paper jam occurs, the spray rate may temporarily be increased as the cleaning system may temporarily have to handle full ink capacity.

The exemplary improved cleaning unit 200, as indicated above, may include the enclosure squeegee blade 244 for excess solvent wipe off. An air knife 270 may also be advantageously employed to further control any presence of solvent on a surface of the cleaner roll 229. These elements may attempt to ensure that the surface of the cleaner roll 220 may be completely dry as it comes around back into a cleaning nip between the cleaner roll 220 and the reimageable surface 215. If solvent is not completely removed, the remaining solvent has the potential to swell the reimageable surface 215, reduce the surface energy of the surface of the cleaner roll 220 and/or provide a low viscosity splitting layer, each of which effects may reduce the effectiveness of the cleaner roll 220. The enclosure squeegee blade 244 may act as a wiper blade to catch any small drops of solvent which manage to make it through the cleaning web 252. The enclosure squeegee blade 244 may be ideally formed of a conformable hydrophobic material. The enclosure squeegee blade 244 may act to seal the enclosed cleaning environment as a cleaning chamber to help minimize volatile organic compound generation or migration to the surrounding environment. An air knife 270, which may be positioned external to the cleaning chamber, may be provided to remove any remaining liquid that has managed to make it past the enclosure squeegee blade 244. This architecture minimizes volatile organic compound creation by the air knife 270 by placing the air knife 270 outside the cleaning chamber and downstream of the enclosure squeegee blade 244 in a process direction.

The disclosed schemes are not considered to be limiting. For example, a cleaning belt may be provided for longer time periods for pre-soak, and longer wrapping lengths for cleaning web engagement, as well as post cleaning dry off. The cleaning web material is ideally made from a low cost polyester material with continuous fibers so as not to be susceptible to fraying and have high mechanical strength under tension even when fully soaked with a water/solvent mixture. The enclosure squeegee blade 244 may be angled in relation to gravity to allow for excess solvent run off. The system may be built up from existing off the shelf cleaning web modules.

Figure 3:
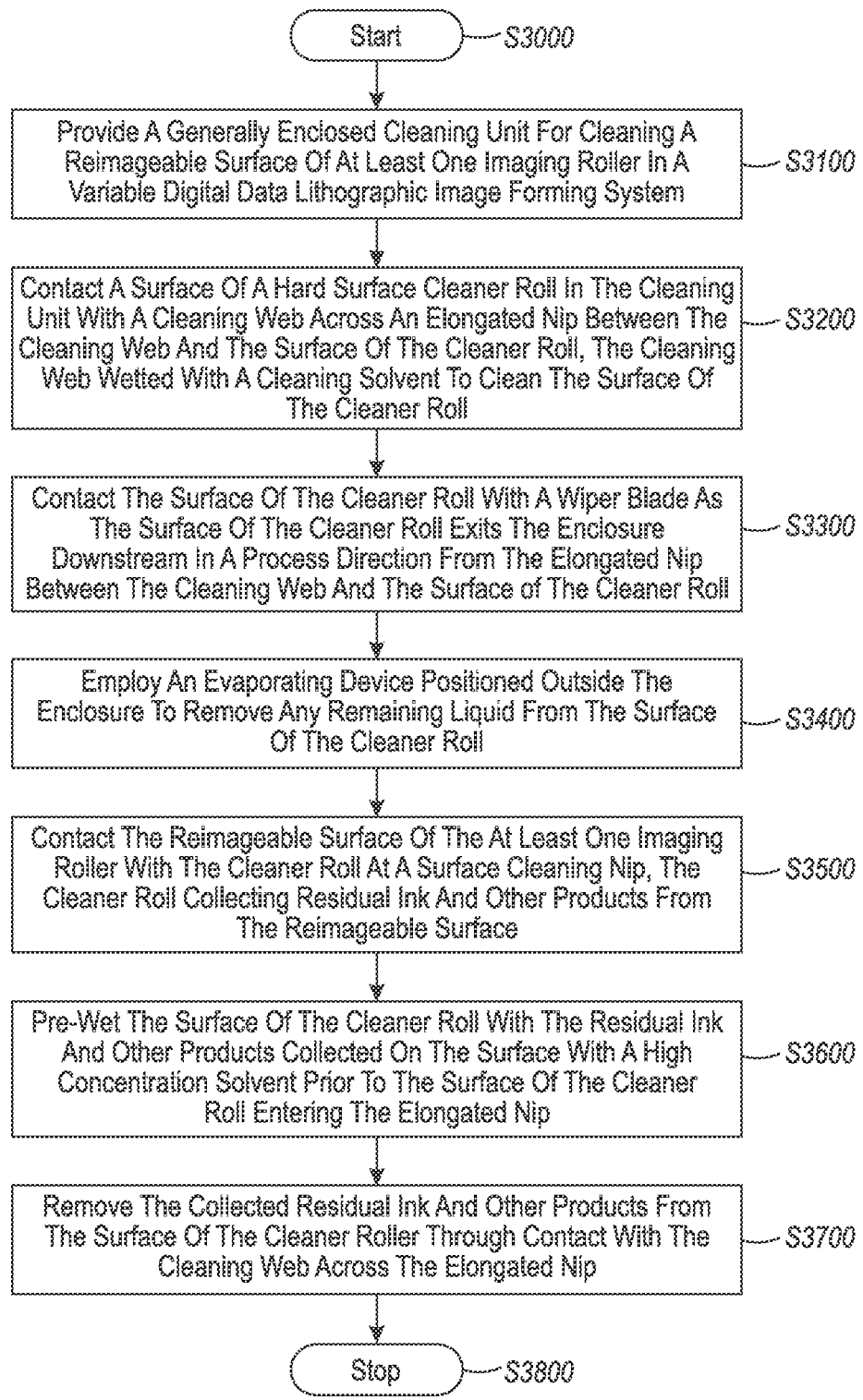
FIG. 3 illustrates a flowchart of an exemplary method for implementing a single pass cleaning process for reimageable surface cleaning in a proposed variable data digital lithographic image forming system according to this disclosure.

The disclosed embodiments may include an exemplary method for implementing a single pass cleaning process for reimageable surface cleaning in a proposed variable data digital lithographic image forming system. FIG. 3 illustrates a flowchart of such an exemplary method. As shown in FIG. 3, operation of the method commences at Step S3000 and proceeds to Step S3100.

In Step S3100, a generally enclosed cleaning unit for cleaning a reimageable surface of at least one imaging roller in a variable digital data lithographic image forming system may be provided. Operation of the method proceeds to Step S3200.

In Step S3200, a surface of a hard surfaced cleaner roll in the cleaning unit may be contacted with a cleaning web. The cleaning web may be configured to have elongated contact interface across an extended surface of the cleaner roll in the form of any elongated cleaning nip. The cleaning web may be wetted with a cleaning solvent to clean a surface of the cleaner roll. Operation of the method proceeds to Step S3300.

In Step S3300, the surface of the cleaner roll may be contacted with a wiper blade as the surface of the cleaner roll exits the enclosed portion of the cleaning unit downstream in a process direction from the elongated nip between the cleaning web and the surface of the cleaner roll. This contact is intended to remove residual liquid on the surface of the cleaner roll and to keep the solvent generally enclosed within the cleaning unit to, for example, limit exposure of the surrounding environment to volatile organic compounds in the solvent. Operation of the method proceeds to Step S3400.

In Step S3400, an evaporating device such as, for example, an air knife, may be employed outside the enclosure to remove any remaining liquid from the surface of the cleaner roll. For the reasons indicated above, any residual liquid on the surface of the cleaner roll may adversely affect the cleaning process for the reimageable surface. Operation of the method proceeds to Step S3500.

In Step S3500, the reimageable surface of the at least one imaging roller may be contacted with the dry surface of the cleaner roll at a surface cleaning nip. Exiting the cleaning nip, the cleaner roll may have collected residual ink and other products from the reimageable surface. Operation of the method proceeds to Step S3600.

In Step S3600, the surface of the cleaner roll with the residual ink and other products collected thereon may be pre-wetted with a high concentration cleaning solvent prior to the surface of the cleaner roll entering the elongated nip in contact with the cleaning web. Operation the method proceeds to Step S3700.

In Step S3700, the collected residual ink other products may be removed from the surface of the cleaner roller through contact with the cleaning web across the elongated nip. Operation the method proceeds to Step S3800, where operation of the method ceases.

The above-described exemplary systems and methods may reference certain conventional lithographic image forming device components to provide a brief, background description of image forming means that may be modified to carry out variable digital data lithographic image forming for images which include, at least in part, advanced surface cleaning techniques as described in detail above. No particular limitation to a specific configuration of the variable data digital lithography portions or modules of an overall variable data digital lithographic image forming system is to be construed based on the description of the exemplary elements depicted and described above.

Those skilled in the art will appreciate that other embodiments of the disclosed subject matter may be practiced with many types of image forming elements common to lithographic image forming systems in many different configurations. As mentioned briefly above, experimental cleaning units have taken on numerous different configurations. The disclosed systems and methods are directed to a broad configuration of such a cleaning unit and are not intended to imply any potentially limiting configuration based on the above description and the accompanying drawings.

The exemplary depicted sequence of executable method steps represents one example of a corresponding sequence of acts for implementing the functions described in the steps. The exemplary depicted steps may be executed in any reasonable order to carry into effect the objectives of the disclosed embodiments. No particular order to the disclosed steps of the method is necessarily implied by the depiction in FIG. 3, and the accompanying description, except where a particular method step is reasonably considered to be a necessary precondition to execution of any other method step. Individual method steps may be carried out in sequence or in parallel in simultaneous or near simultaneous timing. Additionally, not all of the depicted and described method steps need to be included in any particular scheme according to disclosure.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

We claim:

1. A cleaner component in a variable data digital image forming system, comprising:
    an enclosure for substantially enclosing a plurality of cleaning unit components;
    a cleaner roll, as a first one of the plurality of cleaning unit components, the cleaner roll contacting a reimageable surface of an imaging member in an image forming device at a first cleaner nip to remove ink from the reimageable surface;
    a first wetting unit, as a second one of the plurality of cleaning unit components, the first wetting unit wetting a surface of the cleaner roll with a first solvent between the first cleaner nip and a second cleaner nip;
    a cleaning surface component, as a third one of the plurality of cleaning unit components, that contacts the wetted surface of the cleaner roll at the second cleaner nip to remove the ink from the surface of the cleaner roll;
    a second wetting unit, as a fourth one of the plurality of cleaning unit components, that wets a surface of the cleaning surface component with a second solvent prior to the cleaning surface component contacting the surface of the cleaner roll at the second cleaner nip; and
    a wiper unit, as a fifth one of the plurality of cleaning unit components, positioned at an exit of the enclosure in a process direction, the wiper unit being configured to remove residual liquid from the surface of the cleaner roll.

2. The cleaner component of claim 1, further comprising an evaporator device that is positioned downstream in a process direction from the wiper unit to actively evaporate residual liquid from the surface of the cleaner roll.

3. The cleaner component of claim 2, the evaporator device being an air knife.

4. The cleaner component of claim 1, the cleaning surface component comprising a web material that is threaded from a supply roller to a take up roller around at least a pair of contact rollers, the at least the pair of the contact rollers cooperating to form an elongated contact area as the second cleaner nip between the web material and the cleaner roll.

5. The cleaner component of claim 1, the cleaning surface component comprising a plurality of sponge surface roller components arranged in sequence to form the second cleaner nip.

6. The cleaner component of claim 1, the first solvent having a higher concentration of a cleaning component in water than the second solvent.

7. The cleaner component of claim 6, the first solvent being composed of mostly water, more than 90% by weight and a small amount of an ionic surfactant less than 5% by weight and isopropyl alcohol or ethanol less than 5% by weight.

8. The method of claim 1, the first solvent having a higher concentration of a cleaning component in water than the second solvent.

9. The method of claim 8, the first solvent comprising water, more than 90% by weight and a small amount of an ionic surfactant less than 5% by weight and isopropyl alcohol or ethanol less than 5% by weight.

10. A variable data digital lithographic image forming system, comprising:
    a reimageable surface on an imaging member;
    a dampening solution source that deposits a layer of dampening solution on the reimageable surface of the imaging member;
    an optical source that patterns the layer of the dampening solution on the reimageable surface according to an image input;
    an ink source that inks the patterned reimageable surface, the ink being transferred from the reimageable surface to a substrate at an imaging nip to form an image on the substrate; and
    a cleaning unit that comprises:
        an enclosure for substantially enclosing a plurality of cleaning unit components;
        a cleaner roll, as a first one of the plurality of cleaning unit components, the cleaner roll contacting the reimageable surface at a first cleaner nip to remove ink from the reimageable surface;
        a first wetting unit, as a second one of the plurality of cleaning unit components, the first wetting unit wetting a surface of the cleaner roll with a first solvent between the first cleaner nip and a second cleaner nip;
        a cleaning surface component, as a third one of the plurality of cleaning unit components, the cleaning surface component contacting the wetted surface of the cleaner roll at the second cleaner nip to remove the ink from the surface of the cleaner roll;
        a second wetting unit, as a fourth one of the plurality of cleaning unit components, the second wetting unit wetting the cleaning surface component with a second solvent prior to the cleaning surface component contacting the surface of the cleaner roll at the second cleaner nip; and
        a wiper unit, as a fifth one of the plurality of cleaning unit components, positioned at an exit of the enclosure in a process direction, the wiper unit being configured to remove residual liquid from the surface of the cleaner roll.

11. The variable data digital lithographic image forming system of claim 10, the cleaning unit further comprising an evaporator device that is positioned downstream in a process direction from the wiper unit to actively evaporate residual liquid from the surface of the cleaner roll.

12. The variable data digital lithographic image forming system of claim 11, the evaporator device being an air knife.

13. The variable data digital lithographic image forming system of claim 10, the cleaning surface component comprising a web material that is threaded from a supply roller to a take up roller around at least a pair of contact rollers, the at least the pair of contact rollers cooperating to form an elongated contact area as the second cleaner nip between the web material and the cleaner roll.

14. The variable data digital lithographic image forming system of claim 10, the cleaning surface component comprising a plurality of sponge surface roller components arranged in sequence to form the second cleaner nip.

15. The variable data digital lithographic image forming system of claim 10, the first solvent having a higher concentration of a cleaning component in water than the second solvent.

16. The variable data digital lithographic image forming system of claim 15, the first solvent being composed of mostly water, more than 90% by weight and a small amount of an ionic surfactant less than 5% by weight and isopropyl alcohol or ethanol less than 5% by weight.

17. A method for cleaning a reimageable surface in a variable data digital image forming system, comprising:
providing an enclosure for substantially enclosing a plurality of cleaning unit components;
contacting a reimageable surface of an imaging member with a cleaner roll at a first cleaner nip, the cleaner roll being a first one of the plurality of cleaning unit components that is configured to remove ink from the reimageable surface at the first cleaner nip;
wetting a surface of the cleaner roll with a first wetting unit dispensing a first solvent, the first wetting unit being a second one of the plurality of cleaning unit components positioned between the first cleaner nip and a second cleaner nip;
cleaning the surface of the cleaner roll with a cleaning surface component as a third one of the plurality of cleaning unit components that contacts the wetted surface of the cleaner roll at the second cleaner nip to remove the ink from the surface of the cleaner roll;
wetting the cleaning surface component with a second wetting unit, as a fourth one of the plurality of cleaning unit components, dispensing a second solvent prior to the cleaning surface component contacting the surface of the cleaner roll at the second cleaner nip; and
wiping, with a wiper unit as a fifth one of the plurality of cleaning unit components, residual liquid from the surface of the cleaner roll, the wiper unit being positioned at an exit of the enclosure in a process direction.

18. The method of claim 17, further comprising actively evaporating residual liquid from the surface of the cleaner roll using an evaporator device that is positioned downstream in a process direction from the wiper unit.

19. The method of claim 18, the evaporator device being an air knife.

20. The method of claim 17, the cleaning surface component comprising a web material that is threaded from a supply roller to a take up roller around at least a pair of contact rollers, the at least the pair of the contact rollers cooperating to form an elongated contact area as the second cleaner nip between the web material and the cleaner roll.

21. The method of claim 17, the cleaning surface component comprising a plurality of sponge surface roller components arranged in sequence to form the second cleaner nip.

* * * * *